United States Patent
Shirasaki

(10) Patent No.: US 9,817,308 B2
(45) Date of Patent: Nov. 14, 2017

(54) PELLICLE

(71) Applicant: SHIN-ETSU CHEMICAL CO., LTD., Tokyo (JP)

(72) Inventor: Toru Shirasaki, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/047,134

(22) Filed: Feb. 18, 2016

(65) Prior Publication Data

US 2016/0291460 A1   Oct. 6, 2016

(30) Foreign Application Priority Data

Mar. 30, 2015 (JP) ................... 2015-068360
Oct. 7, 2015 (JP) ................... 2015-199104

(51) Int. Cl.
G03F 1/64 (2012.01)
G03F 1/62 (2012.01)

(52) U.S. Cl.
CPC ..................... *G03F 1/64* (2013.01)

(58) Field of Classification Search
None
See application file for complete search history.

(56) References Cited

U.S. PATENT DOCUMENTS

2003/0150329 A1* 8/2003 Kamono ............ G03F 1/66
95/291
2016/0154299 A1* 6/2016 Choi ............ G03F 1/64
430/5

FOREIGN PATENT DOCUMENTS

JP   10-198021 A   7/1998
JP   2010-256434 A   11/2010

* cited by examiner

*Primary Examiner* — Stephen Rosasco
(74) *Attorney, Agent, or Firm* — Westerman, Hattori, Daniels & Adrian, LLP

(57) ABSTRACT

There is provided a pellicle wherein the pellicle frame is formed with a protrusion which extends either inward or outward from the pellicle frame so that an air passage (vent hole) can extend in it to turn upward or downward to open in the atmosphere or in the pellicle closed space (the space interior to the pellicle frame) so that it is possible to secure a wider opening area for filtration to enable prompt air ventilation whereby the pellicle membrane does not undergo extreme inflation or deflation and thus the pellicle membrane is protected from damages.

8 Claims, 10 Drawing Sheets upward of pellicle downward of pellicle

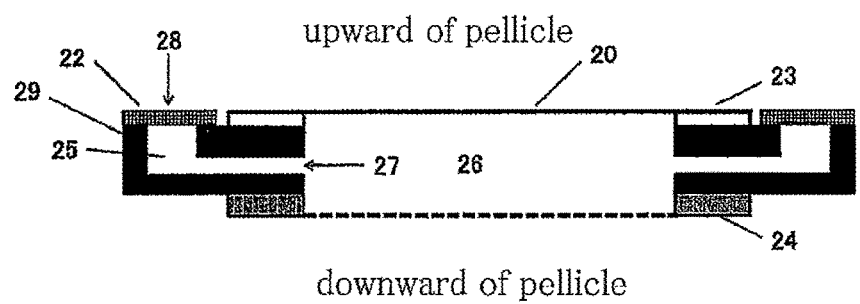
Fig. 9
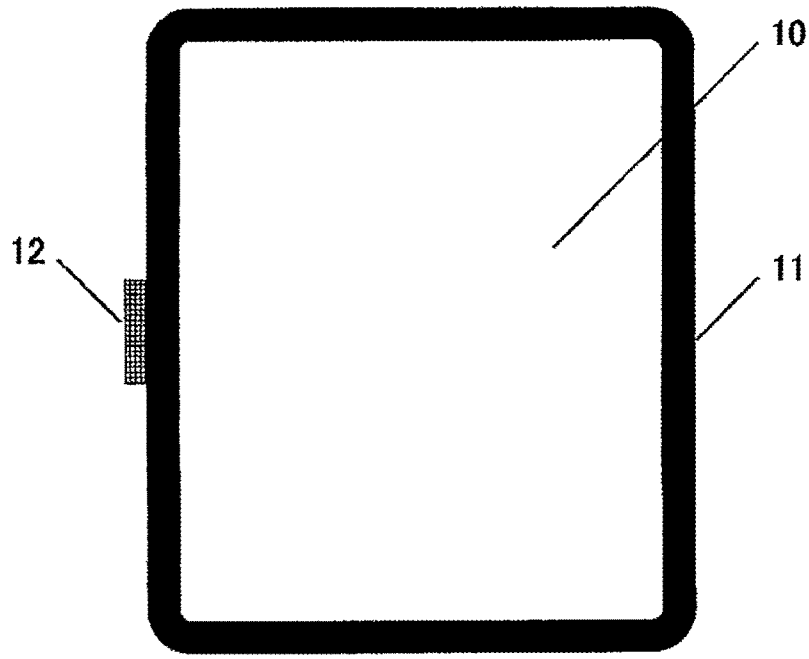
PRIOR ART    Fig. 10

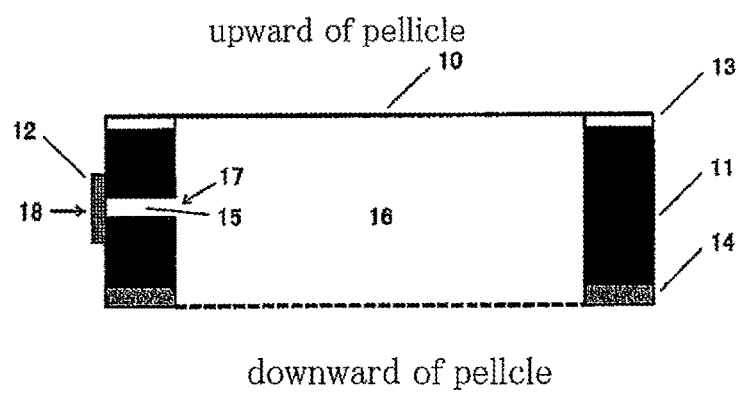
PRIOR ART  Fig. 11
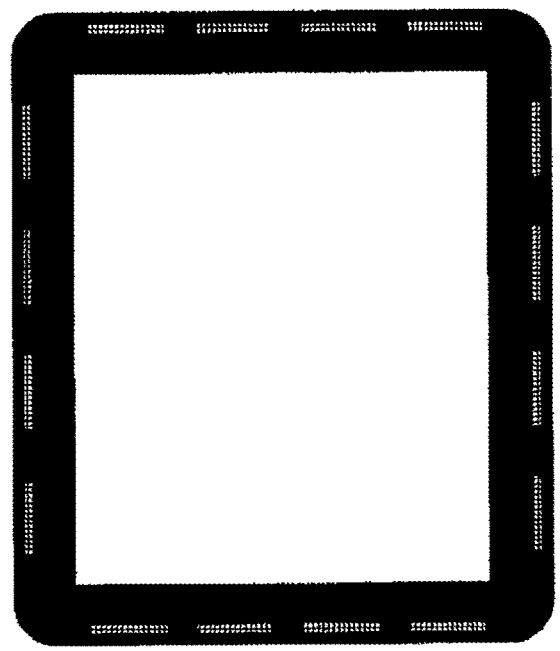
Fig. 12 upward of pellicle downward of pellicle upward of pellicle downward of pellicle

PELLICLE

PRIORITY CLAIMED

The present non-provisional patent application claims priority, as per Paris Convention, from Japanese Patent Applications No. 2015-068360 filed on 2015 Mar. 30 and No. 2015-199104 filed on 2015 Oct. 7, the disclosures of which are incorporated by reference herein in their entirety.

FIELD OF THE INVENTION

The present invention relates to a pellicle for lithography, useful as a dust-fender employed in the scenes of manufacturing a semiconductor device, an IC package, a printed circuit board, a liquid crystal display panel, an organic EL display panel and the like.

BACKGROUND TECHNOLOGY

In recent years, the design rule for LSI has been progressively adopting more refined pattern of sub-quarter micron order, and as a result the shortening of the wavelength of the exposure light source has been compelled. Thus, the exposure light source has been shifted from g-line (436 nm) and i-line (365 nm) lights of the heretofore commonly used mercury lamp to KrF excimer lasers (248 nm) and ArF excimer lasers (193 nm), and studies have been made to further shift to the EUV exposure technology, wherein EUV (Extreme Ultra Violet) light having a dominant wavelength of 13.5 nm in used.

In manufacturing semiconductor devices such as LSI and super-LSI or in manufacturing a liquid crystal display board, a pattern is made by irradiating a light to a semiconductor wafer or a negative plate for liquid crystal; however, if a dust adheres to a mask for lithography (also simply referred to as "mask") or a reticle (collectively referred to as "exposure original plate" herein below) used in this pattern creating stage, the dust absorbs light or bends it, causing deformation of a transferred pattern, roughened edges or black stains on a base, and leads to problems of damaged dimensions, poor quality, deformed appearance and the like.

Thus, these works are usually performed in a clean room, but, even in a clean room, it is yet difficult to keep the exposure original plate clean all the time. Hence, in general the exposure light irradiation is conducted only after a pattern-bearing part of the surface of the exposure original plate is sheltered by a pellicle as a dust fender. Under such circumstances, the dust particles do not directly adhere to the surface of the exposure original plate, but only onto the pellicle membrane, and thus by setting the exposure light to focus at the pattern described on the exposure original plate at the time of lithographing, the dust particles on the pellicle membrane do not affect the transferred image of the pattern.

In general, a pellicle is basically built up in a manner such that a pellicle membrane having a high transmittance against the light used in the exposure process is adhered tensely to an upper annular face of a pellicle frame, and an airtight gasket is adhered to the lower annular face of the pellicle frame. The airtight gasket is generally composed of an agglutinant layer. The pellicle membrane is made of cellulose nitrate, cellulose acetate and a fluorine-containing polymer or the like which transmit well such lights that are often used in the light exposure (e.g., g-line [430 nm] and i-line [365 nm] created by mercury lamp, or KrF excimer laser [248 nm], and ArF excimer laser [193 nm]) or in the case of the EUV exposure, a very thin silicon is being studied to make the pellicle membrane.

The pellicle is installed for the purpose of preventing the dust from adhering to the exposure original plate, and the installation is effected as the agglutinant layer of the pellicle is pressed upon the exposure original plate. On this occasion, the pellicle is positioned in a manner such that the pellicle frame entirely surrounds the pattern region formed in the surface of the exposure original plate, so that the pattern region is isolated from the external atmosphere by means of the pellicle so that the dust outside the pellicle cannot reach the pattern region. Thus, a pellicle closed space is created by the pellicle membrane, the pellicle frame and the exposure original plate.

As the pellicle closed space is sealed with the airtight agglutinant layer, it forms an airtight space; hence when the external pressure varies, there occurs a difference in pressure between the inside and the outside of the pellicle with a result that in the case of a pellicle membrane made of a resin such as fluorine-containing polymer, the pellicle membrane is pressed to inflate or deflate. Also, in the case of EUV exposure, the light exposure operation is conducted in vacuum so that an operation chamber of an EUV exposure apparatus is drawn to vacuum each time the mask is entered or removed from the chamber, and if the pellicle membrane is made of an extremely thin rigid silicon film, even a small pressure change is highly liable to break the film.

Accordingly, in order to mitigate the pressure difference across the pellicle membrane, it is a general practice to provide an air passage through the pellicle frame to communicate the inside and outside spaces with each other so that air can pass freely between these spaces. For example, IP Publication 1 describes a pellicle in which an air passage for pressure adjustment is made through a side bar of the pellicle frame and a filter is provided to cover the air passage at the outside wall of the pellicle frame so as to prevent dust particles from entering. Also, IP Publication 2 describes a pellicle for EUV, which comprises a support member having an inner porous part which occupies an area interior to its outer frame, a filter which allows air to permeate through a frame bar of this support member, and a pellicle membrane made of single crystal silicon supported by the porous part of the support member, so that the pellicle membrane does not undergo flections or breakage by pressure changes even when the pellicle is used in vacuum environment.

As described above, a conventional pellicle is commonly provided with an air passage for pressure adjustment and a filter for prevention of particles from entering through this air passage. Also, in such a pellicle, the openings of the air passage are made in the two wall surfaces which are vertical to the upper annular face as well as the lower annular face of the pellicle frame, and also the filter is provided in a manner such that it covers that opening of the air passage which is made in the outside wall of the pellicle frame. The air that is passing a filter loses more of its flow velocity (flow rate) than when it is passing an air passage so that, especially in the case of EUV exposure operation wherein vacuum drawing is conducted and even a slight pressure difference across the pellicle membrane becomes a problem, it is important to increase the area of that opening of the air passage which is covered up with the filter so as to secure a sufficient effective filtering area.

PRIOR ART

IP Publications

[IP Publication 1]

Japanese Patent Application Publication H 10[1998]-198021

[IP Publication 2]
Japanese Patent Application Publication 2010-256434

SUMMARY OF THE INVENTION

Problems the Invention Seeks to Solve

However, in recent years, there is a tendency to reduce the height of the pellicle and accordingly as this the height of the outside wall as well as the inside wall of the pellicle frame is reduced whereby there has arisen a need for narrowing the openings of the air passage as well as the filter's effective filtering area. Especially in the case of a pellicle for EUV a greater extent of reduction in the height of the pellicle is called for, with a consequence that so long as the conventional design of attaching the filter to the outside wall of the pellicle frame is adopted, there remains no choice but to reduce the effective filtering area.

In the case of a pellicle for ArF exposure, which is conducted under the atmospheric pressure, the pressure difference that occurs between the inside and outside of the pellicle closed space is so small that it has not amounted to a problem; however, there is also a foreseen tendency for reduction of the height of the pellicle frame of ArF pellicle so that the size of the filter that can be used to cover the air path at the outer wall of the pellicle frame is being substantially limited.

On the other hand, in the case of a pellicle for EUV, it is attached to the mask under the atmospheric pressure, but is in vacuum while it is used in the chamber of the EUV exposure apparatus, so that it is necessary to draw out the air from the pellicle closed space when the EUV pellicle is brought into the chamber of the EUV exposure apparatus. But if the effective filtering area is not sufficiently large, there occurs a pressure difference between the inside and outside of the pellicle closed space whereby it is feared that the pellicle membrane is broken or damaged. Hence it is necessary, in the case of a pellicle for EUV, that the outside opening of the air passage is made sufficiently large before applying a filter to it; however, as described earlier, the height of the EUV pellicle is severely limited so that, so long as the conventional design of attaching the filter to the outside wall of the pellicle frame is stuck to, it has become very difficult to provide a sufficiently large outside opening to the air passage and also to attach a filter to it.

The present invention was made in view of the above-stated circumstances, and it is therefore an object of the present invention to provide a pellicle which enables, in spite of the reduced height of the pellicle, an air passage to have an outside opening of a necessary size and also enables a filter to have a substantially large effective filtering area and further enables the pressure difference between the inside and outside of the pellicle closed space to be sufficiently mitigated.

Means to Solve the Problems

The present invention provides a pellicle which comprises a pellicle frame, a pellicle membrane attached to an upper annular face of the pellicle frame, an air passage which is made through a bar of the pellicle frame and has an opening into a pellicle closed space and an opening into the external space (atmosphere) to thereby communicate the pellicle closed space with the external space, and a filter disposed to close at least part of the air passage; this pellicle is characteristic in that at least one of the openings of said air passage, that is, either the opening that opens in the pellicle closed space or the opening that opens in the external atmosphere is disposed to look either in an upward direction or in a downward direction; this upward direction is a direction facing a plane which includes the pellicle membrane. Also, preferably the filter of the present invention covers at least part of the opening of the air passage which looks either in the upward direction or in the downward direction.

Also, it is preferable that the filter of the present invention is disposed to cover at least part of the at least one of the openings that looks either in the upward direction or in the downward direction; furthermore it is more preferable that an opening of the air passage looks in the upward direction.

Furthermore, in the present invention, it is possible to provide the filter within the air passage or outside the air passage, and in the latter case it is preferable that the air passage is bent or curved; this air passage is preferably formed to extend in a protrusion which is formed to protrude from the inner wall or from the outer wall of the pellicle frame. This protrusion is preferably formed all around the pellicle frame in an endless manner.

Effects of the Invention

According to the present invention, the sizes of an opening of the air passage and the filter are not restricted by the height of the pellicle so that, even when the height of the pellicle is small, it is possible to secure a sufficiently large effective filtering area in the filter whereby it becomes possible to promptly cancel the pressure difference that occurs across the pellicle membrane, and hence the problem of the pellicle breakage and the like is effectively prevented.

BRIEF DESCRIPTION OF DRAWINGS

FIG. 9 A cross section of the pellicle of FIG. 8, showing the position of the filters.

FIG. 10 A schematic view showing a conventional pellicle which is adopted in Comparative Examples 1 and 2.

FIG. 11 A cross section of the pellicle of FIG. 10, showing the position of the filter.

FIG. 12 A schematic view showing an example of the pellicle of the present invention wherein a protrusion protruding from the outer wall of the pellicle frame is made all round the pellicle frame.

EXAMPLES TO EMBODY THE INVENTION

Figure 1:
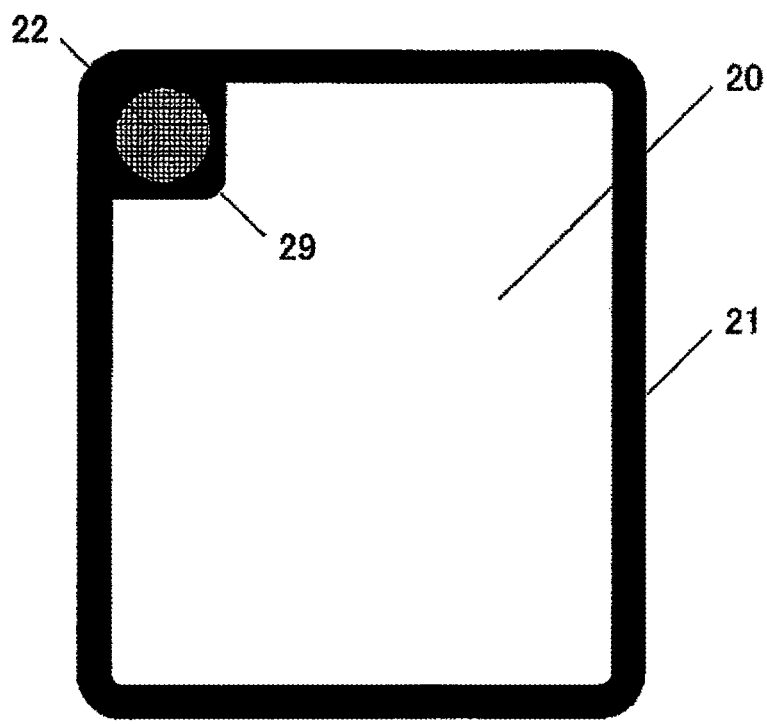
FIG. 1 A schematic view showing an example of the pellicle of the present invention.

Now, the examples of the present invention will be described with reference to the drawings attached, but the present invention shall not be confined to such description.

FIGS. 1, 3, 6, and 8 are schematic views showing examples of the pellicle of the present invention; FIGS. 2, 4, 7, and 9 are cross sections of those pellicles, showing the various positions of the filters. FIG. 5 is a schematic view showing a pellicle which is used in Examples 1 and 3.

A usual pellicle is composed, as shown in FIGS. 10 and 11, of a pellicle frame 11, a pellicle membrane 10, an adhesive layer 13 for bonding the pellicle membrane, an agglutinant layer 14 for bonding a mask base plate or an exposure original plate (hereinafter "mask-bonding agglutinant layer 14"), an air passage 15, a filter 12, etc. Also, ordinarily a separator, not shown in the drawings, is attached to the exposed face of the mask-bonding agglutinant layer 14 for protection thereof.

When this pellicle is adhered to the mask or the exposure original plate (neither are shown), there is created a closed space defined by the pellicle membrane 10, the pellicle frame 11, the mask base plate or the exposure original plate, the pellicle membrane-bonding adhesive layer 13 and the mask-bonding agglutinant layer 14. When the pellicle is not adhered to the mask or the exposure original plate, this space in reality is not a closed one; but for the sake of convenience, we shall call this space a pellicle closed space, whether or not it is closed with the mask or the exposure original plate. Also, in the pellicle of the present invention, we shall call that side of the pellicle where the pellicle membrane-bonding adhesive exists upward and that side of the pellicle where the mask-bonding agglutinant layer exists downward.

In the case of a conventional pellicle like the one shown in FIG. 11, the air passage 15 penetrates the pellicle frame 11 to open in the faces which are vertical to the pellicle membrane-bonding adhesive layer 13 or the mask-bonding agglutinant layer 14 so that the size of the openings of the air passage 15 as well as the size of the filter 12, which is provided to the air passage 15, are limited by the height of the pellicle frame 11.

Figure 2:
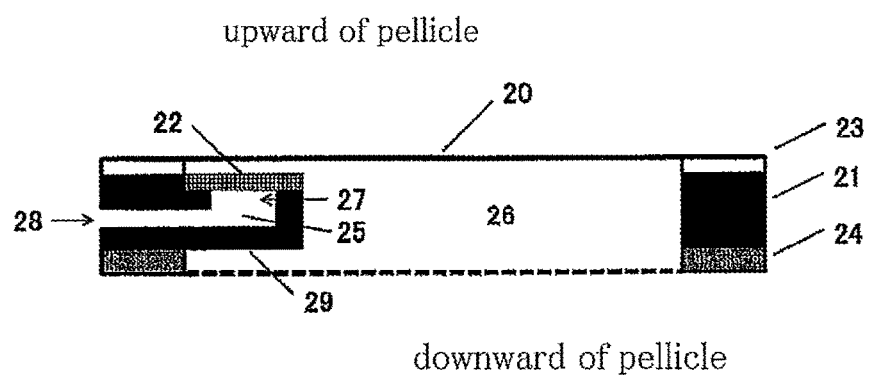
FIG. 2 A cross section of the pellicle of FIG. 1, showing the position of the filter.
Figure 4:
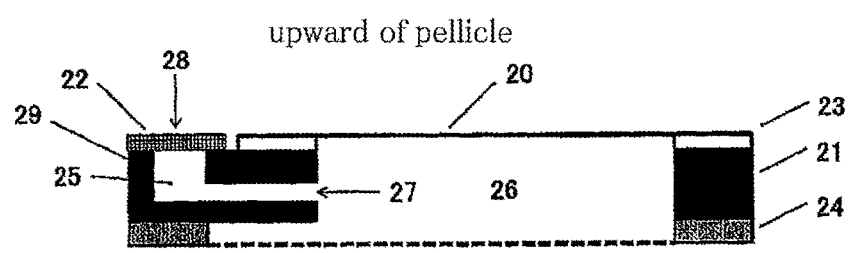
FIG. 4 A cross section of the pellicle of FIG. 3, showing the position of the filter.
Figure 5:
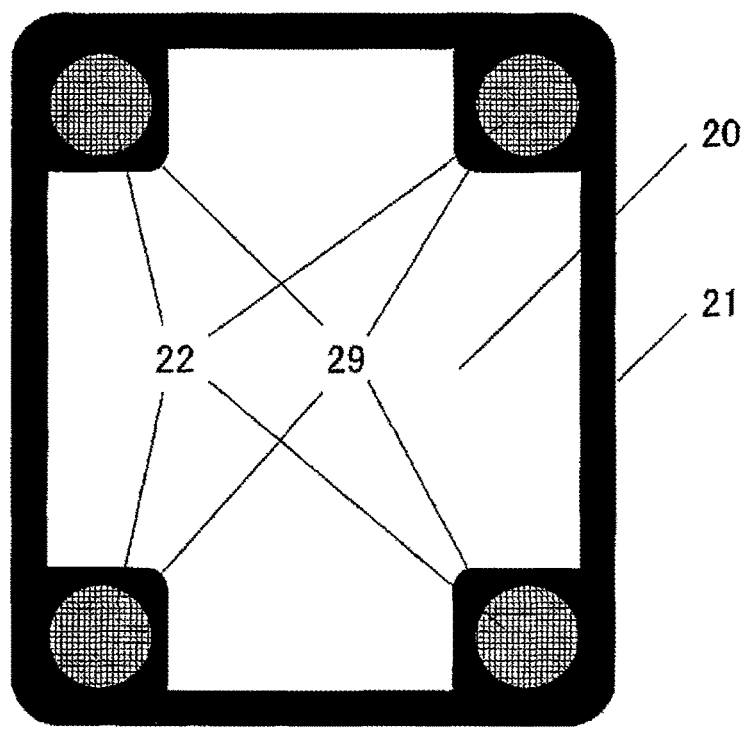
FIG. 5 A schematic view showing a pellicle which is used in Examples 1 and 3.

In contrast to this, in one instance of the pellicle of the present invention, as shown in FIGS. 2 and 4, at least one of the two openings of an air passage is disposed to look upward; namely in the case of the pellicle of FIG. 2, the opening 27 looks upward inside the pellicle closed space 26, and in the case of FIG. 4, the opening 28 looks upward outside the pellicle closed space 26. On the other hand an another instance of the pellicle of the present invention, at least one of the two openings of an air passage is disposed to look downward; namely in the case of the pellicle shown in FIG. 7, the opening 27 of an air passage 25 is disposed to look downward inside the pellicle closed space 26. Moreover, it is possible to modify the opening 28 of the pellicle of FIG. 4 to look downward (outside the pellicle closed space), which is not shown. As such, the size of the opening of the air passage 25 and that of the filter 22, which is provided to the air passage 25, are not limited by the height of the pellicle.

Consequently, in the pellicle of the present invention, it is now possible to use a filter which has a greater effective filtering area than the filters used in the conventional pellicles; however, the circuit pattern is provided within the pellicle closed space, and in the space immediately outside the pellicle closed space a mask handling operation is conducted, so that a too large filter is not acceptable for it would interfere with those items. Although it is a fact that the greater the effective filtering area of the filter is, the higher will the result obtained be, the optimum filter size should be determined based on overall consideration including the avoidance of the interferences with the mask-side circumstances.

Figure 3:
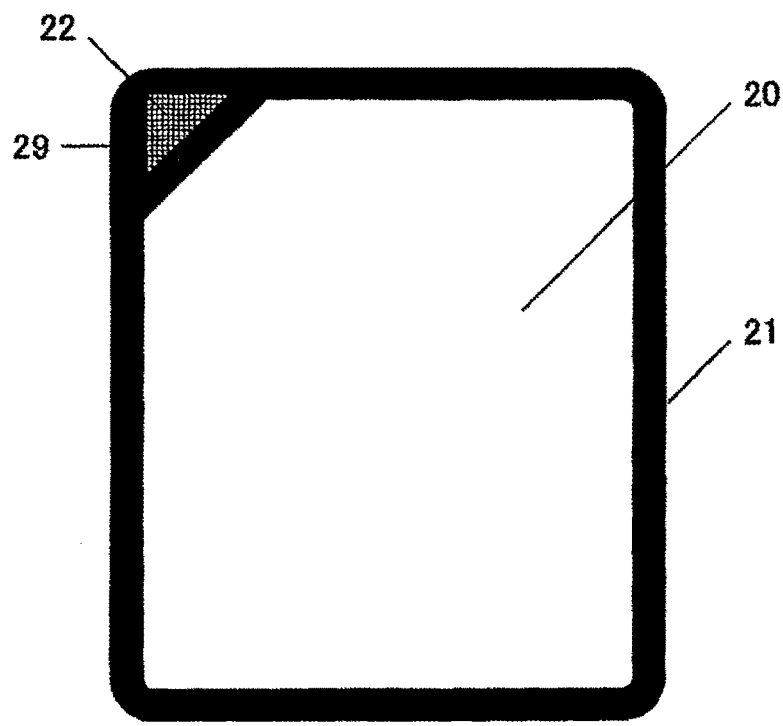
FIG. 3 A schematic view showing another example of the pellicle of the present invention.
Figure 7:
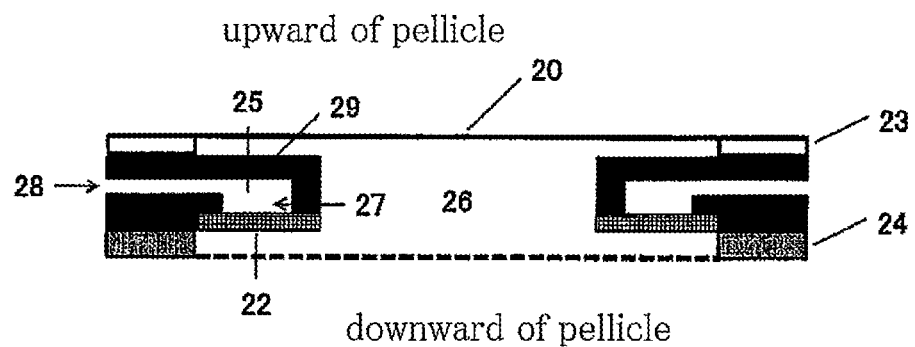
FIG. 7 A cross section of the pellicle of FIG. 6, showing the position of the filters.

The embodiment shown in FIGS. 1 and 2 is an example in which the air passage 25 is formed in the pellicle frame 21 in a manner such that one opening 27 looks upward inside the pellicle closed space 26 while the other opening 28 looks horizontally outside the pellicle closed space 26. On the other hand, the embodiment shown in FIGS. 3 and 4 is an example in which the air passage 25 is formed in the pellicle frame 21 in a manner such that one opening 28 looks upward outside the pellicle closed space 26 while the other opening 27 looks horizontally inside the pellicle closed space 26. In other embodiments of the pellicle of the present invention, it is possible to form an air passage 27 to have its opening 22 look downward, as shown in FIG. 7, for example.

The opening of the air passage which looks upward or downward need not be such that the plane containing the edge of the opening is strictly parallel to the pellicle membrane-bonding adhesive layer 23 or the mask-bonding agglutinant layer 24. However, the greater the angle included between this plane containing the opening edge of the air passage formed in the pellicle frame 21 and the pellicle membrane-bonding adhesive layer 23 or the mask-bonding agglutinant layer 24 becomes, the more extensively will the height of the pellicle limit the size of the area of the opening of the air passage 25 and the size of the filter to be provided to the air passage 25, so that preferably the said angle does not exceed 45 degrees.

In the pellicle of the present invention, it is possible to have both openings of an air passage 25, namely, the opening 27 inside the pellicle closed space and the opening 28 outside the pellicle closed space, look upward or downward; however it is preferable to have only one of them look upward or downward and have the other look horizontally for the reasons of simplicity and cost in manufacturing.

It is preferable that the pellicle frame 21 of the present invention is provided with an extrusion 29, which extends from the inner wall or the outer wall of the pellicle frame 21, and that the air passage 25 for communicating the pellicle closed space with the external atmosphere is made to extend through the extrusion 29. The shape of the air passage 28 is not limited and it can be straight, bent or curved. However, in the case of a straight shape, although the simplicity in manufacturing is maintained, it is possible that the shape of the pellicle frame 21 and the position where the opening of the air passage 25 is to be made are limited by the air passage 25. Hence, the shape of the air passage 25 is preferably bent or curved, and from the consideration of the simplicity of the manufacturing it is more preferable to have it bent. In the case of the bent air passage, the bent corners may be edged or they may be rounded by chamfering or the like. Also, there is no limitation to the bent angle.

In a case where the width of the pellicle frame 21 can be made greater than usual, it is possible to provide in the upper annular face of pellicle frame 21 an outer area where no pellicle membrane-bonding adhesive layer 23 is laid and make an opening of the air passage 25 in this area; or similarly it is possible to provide in the lower annular face of the pellicle frame 21 an outer area where no mask-bonding agglutinant layer 24 is laid and make an opening of the air passage 25 in this area. FIGS. 12 through 15 show embodiments in which a number of openings are made in the outer part of the pellicle frame 21 throughout the circumference. These embodiments can be deemed such that a number of the protrusion 29 are formed continuously throughout the circumference of the pellicle frame 21. This design is preferable in that no convex protrusion occurs so that the pattern area formed on the photomask is not interfered with by it or the handling of the mask and pellicle is not interfered with either.

The filter 22 of the present invention is disposed to close at least part of the air passage 25, and it is possible to bury the filter 22 entirely within the air passage 25, or it is also possible to attach it to cover the opening 25 of the air passage such that no part of the filter 22 is inside the air passage 25. It is preferable that the filter 22 is attached to the opening of the air passage such that it entirely covers the opening, whether the opening is upward or downward. In the pellicle of the present invention, it is possible to expand the area of the opening, whether it is looking upward or downward, arbitrarily irrespective of the height of the pellicle, so that by using a filter 22 of such a size that the entirety of this opening is covered, the effective filtering area of the filter 22 is expanded as well.

There is no limit to the material or the structure of the filter 22, and any conventional filter can be used. For example, it is possible to use a filter consisting of a porous material such as a resin, a ceramics, a metal, or the like, or it is also possible to use a filter fabricated by combining fibrous materials.

In the pellicle of the present invention, it is preferable that an opening 27 of the air passage 25 which opens inside the pellicle closed space looks upward, and it is also preferable that the filter 22 is attached to this up-looking opening in the pellicle closed space 26 in a manner such that the entirety of the opening 27 is covered. This arrangement is propitious in order to prevent a dust particle or the like that enters the pellicle closed space 26 through the air passage 25 from falling directly upon the mask base plate or the exposure original plate. Also, this is preferable, especially in the case of EUV exposure, because it is thought that if the opening 27 of the air passage 25 is looking downward and thus toward the mask base plate or the exposure original plate in the pellicle closed space 26, then when the pressure in the pellicle closed space is changed to the atmospheric pressure from vacuum, dust or the like would come in through the air passage 25 blown by the incoming air whereby the dust or the like could penetrate the filter and reach the mask base plate or the exposure original plate.

The sizes of the individual members that constitute the pellicle of the present invention are similar to those adopted in the conventional pellicles, for example the pellicles for lithography employed in the manufacture of a semiconductor IC package or in the manufacture of a large-sized liquid crystal display panel; it is possible to modify the respective sizes to answer various demands. Also, there is no particular limits to the materials to make the constituents of the pellicle, and any conventionally known materials are acceptable.

There is no particular limit to the material for the pellicle membrane 20, but the kind that has a high remittance and light resistance to the lights of the wavelengths commonly adopted for exposure light source is preferred. For example, amorphous fluorine-containing polymer or the like that is used with conventional excimer laser may be used. Examples of amorphous fluorine-containing polymer include CYTOP (a product name of ASAHI GLASS CO., LTD), Teflon (a registered trademark), and AF (a registered trademark of Du Pont). These polymers may be dissolved in a solvent, as need be, at the time of making a pellicle membrane; for example, it is possible to use solvents such as fluorine-containing solvent for smooth dissolving.

Nor is there any particular limitation to the method for tensely installing the pellicle membrane 20 on the pellicle frame 21, and any conventionally used method can go.

As for the adhesive to adhere the pellicle membrane 20 to the pellicle frame 21 may be anything that have been conventionally used. In particular, for example, acrylic resin adhesive, epoxy resin adhesive, silicone resin adhesive, or fluorine-containing polymers such as fluorine-containing silicone adhesive can be used. Among these the fluorine-containing polymers are preferred. Examples of the fluorine-containing polymers include CYTOP (a product name of ASAHI GLASS CO., LTD). The adhesive is diluted in a solvent, as need be, and is applied to the upper annular face of the pellicle frame. On this occasion the method adopted may be brushing, spraying, by automatic dispenser or the like.

As for the mask-bonding agglutinant layer 24 for adhering the pellicle to the mask base plate, it is possible to use any conventionally used adhesive such as a double sided adhesive tape, silicone-type agglutinant, and acrylic-type agglutinant. Normally, the agglutinant layer 24 is formed on the lower annular face of the pellicle frame 21, and further a separator (not shown) is detachably applied to the agglutinant layer 24.

The material to make the separator is not limited in particular, and examples include polyethylene terephthalate (PET), polytetrafluoroethylene (PTFE), tetrafluoroethylene-perfluoro(alkyl vinyl ether) copolymer (PFA), polyethylene (PE), polycarbonate (PC), polyvinyl chloride (PVC), and polypropylene (PP). The separator may be coated with a releasing agent such as silicone-type releasing agent and fluorine-containing releasing agent, the selection being made depending on the agglutinant strength of the mask-bonding agglutinant layer 24. This separator can be omitted through a modification in the design of the pellicle container or pellicle support method.

There is no limitation to the mother material for the pellicle frame 21 of the present invention so long as it has such strength and rigidity as are required of the pellicle frame, and examples of such include aluminum, aluminum alloy (such as JIS 5000 series, JIS 6000 series, and JIS 7000 series), iron, iron alloy, ceramics (such as SiC, AlN, and $Al_2O_3$), ceramics/metal composite material (such as Al—SiC, Al—AlN, and Al—$Al_2O_3$), carbon steel, tool steel, stainless steel, engineering plastic (such as PE, PA, and PEEK), carbon fiber composite material (such as GFRP and CFRP). Among these aluminum and aluminum alloy are preferable because of their favorable strength, rigidity weight and cost.

It is possible, as need be, to apply to the surface of the pellicle frame 21 such treatments as anodic oxidation, plating, polymer coating, and dying. Also, in order to suppress the reflection of the exposure light and to improve the accuracy of the visual foreign material inspection, the pellicle frame 21 is preferably black in color. Especially in the case where the mother material of the pellicle frame 21 is aluminum alloy, it is preferable that the surface of the pellicle frame is roughened by abrasive such as stainless beads, glass beads, and carborundom, and then is subjected to black alumite treatment.

In order to capture foreign particles it is possible to apply an adhesive to that part of the pellicle frame 21 which faces the pellicle closed space. Furthermore, as need be, it is possible to add various constitutional elements; also, so long as the function of pellicle is retained, it is possible to remove part of constitutional elements.

Incidentally, the pellicle frame of the pellicle for EUV can be made of a material similar to that which has been used to make the pellicle frame of the pellicle for excimer laser. Also, the pellicle membrane can consist of a support member having a porous section and a single crystal pellicle membrane supported by the porous section of the support member. When the single crystal pellicle membrane is tensely adhered to the pellicle frame, it is possible to use a silicone resin adhesive, and it is specially preferable to use a kind of silicone resin which is modified to release less outgas. On the other hand, it is possible to use a silicone resin agglutinant for the agglutinant layer to bond the pellicle to the exposure original plate, and in this case too it is preferable to use a kind of silicone resin agglutinant which is modified to release less outgas.

With regard to the filter, it is possible to use a kind that has been commonly used in excimer laser pellicle. So, it is possible to use a filter consisting of porous material made from resin, ceramics, metal or the like, or a filter fabricated by combining fibrous materials.

In the EUV exposure operation, it is necessary to render the inside of the exposure apparatus vacuum after the pellicle-bearing mask base plate or the pellicle-bearing exposure original plate is placed inside the exposure apparatus, and also it is necessary to change the pressure inside of the exposure apparatus from vacuum to atmospheric pressure before the pellicle-bearing plate is removed from the exposure apparatus. On the occasion when the inside of the exposure apparatus is turned from the vacuum to the atmospheric pressure, it is necessary to cause the air to flow into the pellicle closed space defined between the pellicle and the exposure original plate so as to prevent a pressure difference from occurring between the outside and inside of the pellicle closed space; on account of this necessity, in the EUV pellicle it is necessary to secure a higher ventilation capacity than in the case of the conventional excimer laser pellicle. Therefore, it is very important to enlarge that opening of the air passage 25 which receives a filter 22 so as to allow the filter 22 to have a sufficiently large effective filtering area.

Herein below, we will explain the present invention in a concrete manner using examples and comparative examples. Incidentally, the mask base plates used in the examples and comparative examples are employed merely for the purpose of comparison and the present invention can be applicable to the entire range of exposure original plates.

Example 1

In Example 1, at first, an aluminum alloy pellicle frame 21 having an external dimension of 149 mm×115 mm×2.5 mm and an internal dimension of 145 mm×111 mm×2.5 mm was prepared. Then, as shown in FIG. 5, a protrusion 29 with a thickness of 2 mm was made at each one of the four corners of the pellicle frame 21 so as to provide an opening 27 to the air passage 25 in a manner such that the protrusion 29 extends inward from the pellicle frame 21. Then, each protrusion 29 was formed with an opening 27 having a diameter of 10 mm and looking upward, as shown in FIG. 2, and furthermore another opening 28 having a diameter of 1 mm was formed to the air passage 25 looking horizontally outside from the pellicle frame 21 whereby the air passage 25 was completed.

Next, the pellicle frame 21 thus formed with the air passages 25 was washed in pure water, and then a silicone agglutinant (X-40-3122, manufactured by Shin-Etsu Chemical Co., Ltd.) was applied to the lower annular face of the pellicle frame 21, and a CYTOP adhesive (CTX-A, a product name of ASAHI GLASS CO., LTD) was applied to the upper annular face of the pellicle frame 12. Then the pellicle frame 21 was heated to 130 degrees C., whereby the agglutinant and the adhesive were cured.

Next, an agglutinant in the shape of a sheet of 0.5-mm-wide ring having an outer diameter of 11 mm was applied to an outermost area of a lower face (as seen in FIG. 2) of a PTFE filter 22 having a diameter of 11 mm, and this filter 22 (having an effective filtering area of 78.5 mm$^2$) was adhered to the protrusion 29 of the pellicle frame 21 in a manner such that the filter 22 completely covers the opening 27. Then, a preformed pellicle membrane 20 having a thickness of 0.28 micrometer was made out of a CYTOP (CTX-S, a product name of ASAHI GLASS CO., LTD), and this membrane was attached to a temporary aluminum frame having a greater expansion than the pellicle frame 21. This pellicle membrane 20 was then adhered to the upper annular face of the pellicle frame 21, and that portion of the pellicle membrane 3 which extended beyond the outer edges of the pellicle frame 21 was cut and removed, whereby a pellicle of Example 1 was completed.

In the end, this pellicle was adhered to a mask base plate measuring 150 mm×150 mm, and this pellicle-bearing mask base plate was put in a vacuum box and the pressure therein was reduced such that in 10 seconds it was 33 kPa. At this time the pellicle membrane 20 was inflated by 3 mm at its middle part due to the differential pressure across the pellicle membrane; the pressure reduction operation was continued and the inflation of the pellicle membrane 20 gradually receded and disappeared in 5 minutes.

Example 2

Figure 6:
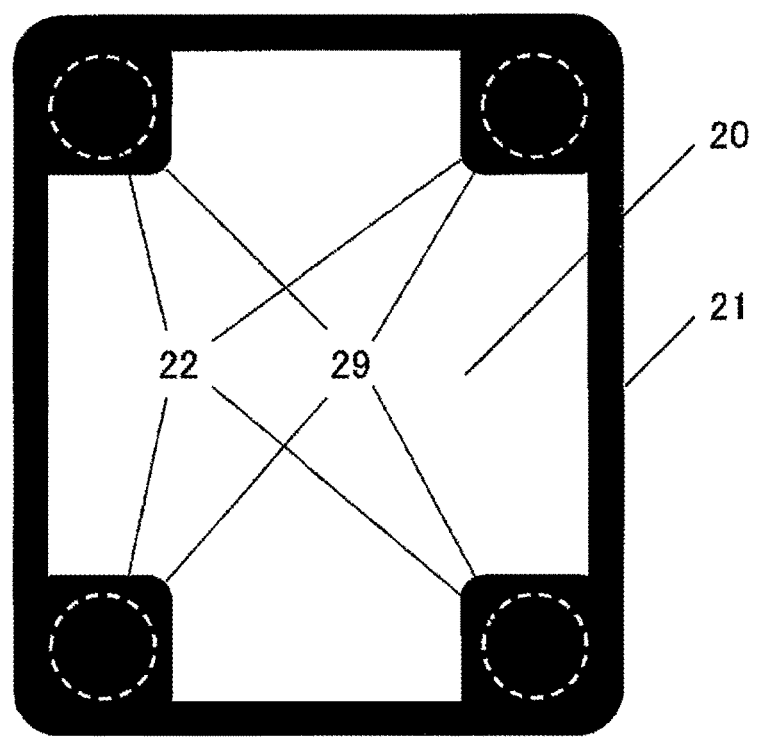
FIG. 6 A schematic view showing still another example of the pellicle of the present invention.

Example 2 is similar to Example 1 except that an opening of each air passage 25 looks downward. In other words at first, as in Example 1, an aluminum alloy pellicle frame 21 having an external dimension of 149 mm×115 mm×2.5 mm and an internal dimension of 145 mm×111 mm×2.5 mm was prepared. Then, as shown in FIG. 6 and FIG. 7, an inward protrusion 29 with a thickness of 2 mm was made at each one of the four corners of the pellicle frame 21 so as to provide an opening 27 to the air passage 25. Then, each protrusion 29 was formed with an opening 27 having a diameter of 10 mm and looking downward, as shown in FIG. 7, and furthermore another opening 28 having a diameter of 1 mm was formed to the air passage 25 looking horizontally outside from the pellicle frame 21 whereby the air passage 25 was completed.

Then, giving the same treatments as in Example 1 to the pellicle frame 21 formed with the afore-mentioned air passages 25, a pellicle of Example 2 was completed. Then, as in Example 1, this pellicle was adhered to a mask base plate measuring 150 mm×150 mm, and this pellicle-bearing mask base plate was put in a vacuum box and the pressure therein was reduced such that in 10 seconds it was 33 kPa, like in the case of Example 1; as the pressure reduction operation was continued, the same phenomenon took place as in Example 1 wherein the air passage 25 had an opening looking upward.

Example 3

In Example 3, unlike Example 1, an aluminum alloy pellicle frame 21 having an external dimension of 149.4 mm×116.5 mm×1.7 mm and an internal dimension of 145.4 mm×112.6 mm×1.7 mm was prepared. Then, as in Example 1, an inward protrusion 29 with a thickness of 1.7 mm was made at each one of the four corners of the pellicle frame 21 so as to provide an opening to the air passage 25. Then, each protrusion 29 was formed with an opening 27 having a diameter of 10 mm and looking upward, and furthermore another opening 28 having a diameter of 1 mm was formed to the air passage 25 looking horizontally outside from the pellicle frame 21 whereby the air passage 25 was completed.

Next, the pellicle frame 21 formed with the air passage 25 was washed with pure water, and silicone agglutinant (a product of Shin-Etsu Chemical Co., Ltd.) was applied to the lower annular face of the pellicle frame 21. Thereafter, a SUS filter 22 having a diameter of 10 mm and a filtration accuracy of 0.3 micrometer was installed to the passage 25 formed in the protrusion 29 of the pellicle frame 21. On this occasion, the outer circumferential part of the filter 22 was sealed with a silicone potting agent (KE-101A/B, a product name of Shin-Etsu Chemical Co., Ltd.).

Also, a silicone potting agent (manufactured by Shin-Etsu Chemical Co., Ltd.) was applied to the upper annular face of the pellicle frame 21, and a pellicle membrane 20 consisting of a single crystal silicon film and a porous supporting member was adhered to the upper annular face of the pellicle frame 21; then that portion of the pellicle membrane 20 which extended beyond the outer edges of the pellicle frame 21 was cut and removed, whereby a pellicle of Example 3 was completed.

In the end, this pellicle was adhered to a mask base plate measuring 150 mm×150 mm, and this pellicle-bearing mask base plate was put in a vacuum box and the pressure therein was reduced gradually. On this occasion, the pressure reduction ratio was carefully controlled so as not to cause a breakage in the pellicle membrane 20, and as a result it took 10 minutes before the pressure reached 1 kPa.

Example 4

Figure 8:
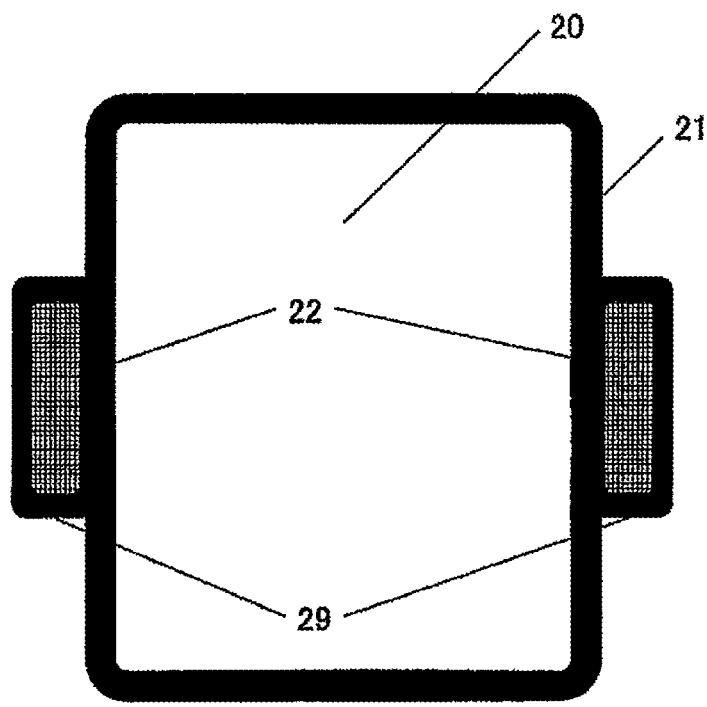
FIG. 8 A schematic view showing a still different example of the pellicle of the present invention.
Figure 13:
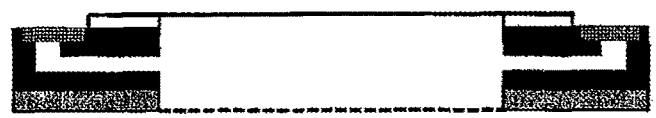
FIG. 13 A cross section of the pellicle of FIG. 12, showing the position of the filters.
Figure 14:
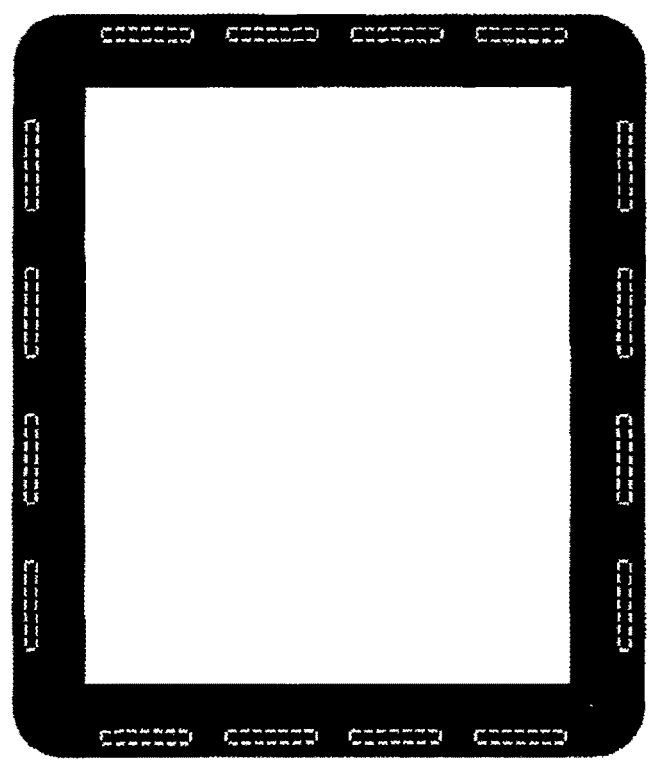
FIG. 14 A schematic view showing another example of the pellicle of the present invention wherein a protrusion protruding from the outer wall of the pellicle frame is made all round the pellicle frame.
Figure 15:
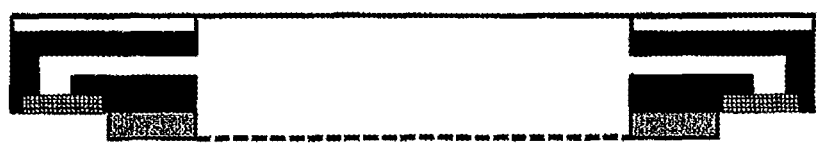
FIG. 15 A cross section of the pellicle of FIG. 14, showing the position of the filters.

As shown in FIGS. 8 and 9, Example 4 is the case in which a protrusion 29 is made to protrude from the outer wall of each one of the longer side bars of the pellicle frame 21, and that opening of the air passage 25 which was made in the protrusion 29 was disposed to look upward. In other words, in Example 4, as in Example 3, an aluminum alloy pellicle frame 21 having an external dimension of 149.4 mm×116.6 mm×1.7 mm and an internal dimension of 145.4 mm×112.6 mm×1.7 mm was prepared; then, in order to provide an opening to the air passage 25 the outward protrusion 29 with a thickness of 1.7 mm was formed on the outer wall of each one of the longer side bars of the pellicle frame 21. Each protrusion 29 was formed with an opening 27 having a length of 30 mm and a width of 10 mm and looking upward; and furthermore another opening 27 having a diameter of 1 mm was formed to the air passage 25 to look horizontally inward from the pellicle frame 21 whereby the air passage 25 was completed.

Next, the pellicle frame 21 formed with the air passage 25 was washed with pure water, and silicone agglutinant (a product of Shin-Etsu Chemical Co., Ltd.) was applied to the lower annular face of the pellicle frame 21. Thereafter, a SUS filter 22 measuring 30 mm by 10 mm and having a filtration accuracy of 0.3 micrometer was installed to the air passage 25 formed in the protrusion 29 of the pellicle frame 21. On this occasion, the outer circumferential part of the filter 22 was sealed with a silicone potting agent (KE-101A/B, a product name of Shin-Etsu Chemical Co., Ltd.).

Also, a silicone potting agent (manufactured by Shin-Etsu Chemical Co., Ltd.) was applied to the upper annular face of the pellicle frame 21, and a pellicle membrane 20 consisting of a single crystal silicon film and a porous supporting member was adhered to the upper annular face of the pellicle frame 21; then that portion of the pellicle membrane 20 which extended beyond the outer edges of the pellicle frame 21 was cut and removed, whereby a pellicle of Example 4 was completed.

In the end, this pellicle was adhered to a mask base plate measuring 152 mm×152 mm, and this pellicle-bearing mask base plate was put in a vacuum box and the pressure therein was reduced gradually. On this occasion, the pressure reduction ratio was carefully controlled so as not to cause a breakage in the pellicle membrane 20, and as a result it took 5 minutes before the pressure reached 1 kPa.

Example 5

Figure 16:
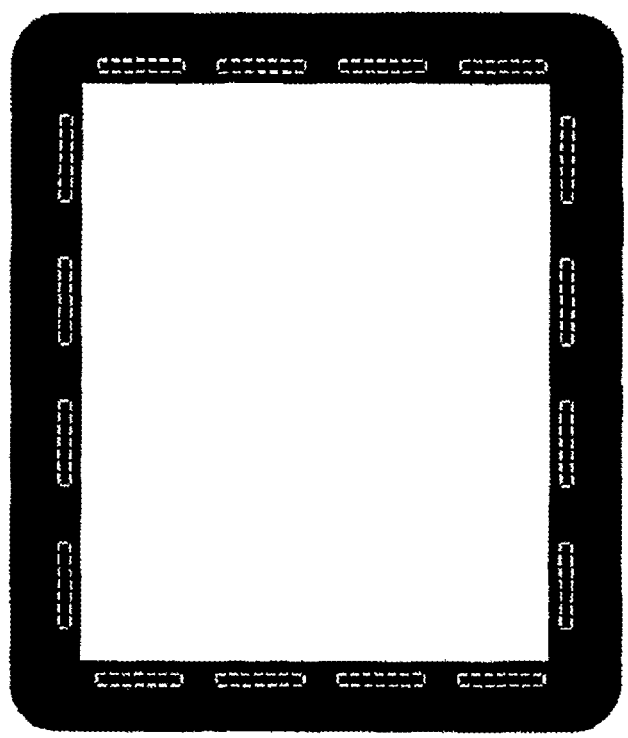
FIG. 16 A schematic view showing an example of the pellicle of the present invention wherein a protrusion protruding from the inner wall of the pellicle frame is made all round the pellicle frame.
Figure 17:
FIG. 17 A cross section of the pellicle of FIG. 16, showing the position of the filters.

Example 5 is the case in which the protrusion 29 encompasses all round the inner wall of the pellicle frame. In Example 5, a super Invar pellicle frame 21 having an external dimension of 151 mm×118.5 mm×1.5 mm and an internal dimension of 143 mm×110.5 mm×1.5 mm was prepared. Now, as shown in FIG. 16 and FIG. 17, it can be deemed that the inner part of the pellicle frame 21 has turned a protrusion 29, in which an opening was made to each one of the air passages 25. More particularly, sixteen openings were made in the pellicle frame 21, each having a length of 10.2 mm and a width of 2.7 mm and looking downward inside the pellicle closed space; and furthermore two openings for each one of the sixteen openings were made to look outside from the pellicle frame 21, and these outside openings had a diameter of 0.8 mm; hence the air passage 25 was completed.

Next, the pellicle frame 21 formed with the air passages 25 was subjected to ultrasonic cleaning in pure water, and silicone agglutinant (X-40-3264, a product of Shin-Etsu Chemical Co., Ltd.) was applied to the lower annular face of the pellicle frame 21. Thereafter, SUS filter 22 measuring 10 mm by 2.5 mm and having a filtration accuracy of 0.3 micrometer was installed to each one of the air passages 25 formed in the protrusion 29 of the pellicle frame 21.

Also, a silicone potting agent (KE-101 manufactured by Shin-Etsu Chemical Co., Ltd.) was applied to the upper annular face of the pellicle frame 21, and a pellicle membrane 20 consisting of a polycrystalline silicon film was adhered to the upper annular face of the pellicle frame 21, whereby a pellicle of Example 5 was completed.

In the end, this pellicle was adhered to a mask base plate measuring 150 mm×150 mm, and this pellicle-bearing mask base plate was put in a vacuum box and the pressure therein was reduced gradually. On this occasion, the pressure reduction ratio was carefully controlled so as not to cause a breakage in the pellicle membrane 20, and as a result it took 5 minutes before the pressure reached 1 kPa.

Comparative Example 1

In Comparative Example 1, like Example 1, at first, an aluminum alloy pellicle frame having an external dimension of 149 mm×115 mm×2.5 mm and an internal dimension of 145 mm×111 mm×2.5 mm was prepared. Then, as shown in FIG. 11, four air passages 15 having a diameter of 1 mm were made to penetrate a bar of the pellicle frame 11 in a manner such that each air passage 15 is vertical to the inner wall and the outer wall of the bar of the pellicle frame 11.

Next, the pellicle frame 11 thus formed with these air passages 15 was washed with pure water, and a silicone agglutinant (a product of Shin-Etsu Chemical Co., Ltd.) was applied to the lower annular face of the pellicle frame 11 and a CYTOP adhesive (CTX-A, a product of ASAHI GLASS CO., LTD) was applied to the upper annular face of the pellicle frame 11. Then the pellicle frame 11 was heated to 130 degrees C., whereby the agglutinant and the adhesive were cured.

Next, an agglutinant in the shape of a sheet of 0.5-mm-wide ring having an outer diameter of 10 mm was applied to an outermost area of a right-side face (as seen in FIG. 11) of a PTFE filter 12 having a diameter of 10 mm and a thickness of 2 mm, and this filter 12 (having an effective filtering area of 9 mm$^2$) was adhered to the outer wall of the pellicle frame 11 in a manner such that the filter 12 completely covers the opening 18. Then, a preformed pellicle membrane 10 having a thickness of 0.28 micrometer was made out of a CYTOP (CTX-S, a product name of ASAHI GLASS CO., LTD), and this membrane was attached to a temporary aluminum frame having a greater expansion than the pellicle frame 11. This pellicle membrane 10 was then adhered to the upper annular face of the pellicle frame 11, and that portion of the pellicle membrane 10 which extended beyond the outer edges of the pellicle frame 11 was cut and removed, whereby a pellicle of Comparative Example 1 was completed.

In the end, this pellicle was adhered to a mask base plate measuring 150 mm×150 mm, and this pellicle-bearing mask base plate was put in a vacuum box and the pressure therein was reduced such that in 10 seconds it was 33 kPa. At this time the pellicle membrane 10 was inflated by 3 mm at its middle part due to the differential pressure across the pellicle membrane; the pressure reduction operation was continued and the inflation of the pellicle membrane 10 gradually receded, but it took 40 minutes until the inflation completely disappeared.

Comparative Example 2

In Comparative Example 2, at first, like Example 3, an aluminum alloy pellicle frame 11 having an external dimension of 149.4 mm×116.5 mm×1.7 mm and an internal dimension of 145.4 mm×112.6 mm×1.7 mm was prepared. Then, as in Comparative Example 1, four air passages 15 having a diameter of 1 mm were made to penetrate a bar of the pellicle frame 11 in a manner such that each air passage 15 was vertical to the inner wall and the outer wall of the bar of the pellicle frame 11.

Next, the pellicle frame 11 thus formed with these air passages 15 was washed with pure water, and a silicone agglutinant (a product of Shin-Etsu Chemical Co., Ltd.) was applied to the lower annular face of the pellicle frame 11. Then, a SUS filter 12 having a diameter of 1.7 mm and a filtering accuracy of 0.3 micrometer was adhered to the outer wall of the pellicle frame 11 in a manner such that the filter 12 completely covers the opening 18. On this occasion, the outer circumferential part of the filter 12 was sealed with a silicone potting agent (KE-101A/B, a product name of Shin-Etsu Chemical Co., Ltd.).

A silicone potting agent (manufactured by Shin-Etsu Chemical Co., Ltd.) was applied to the upper annular face of the pellicle frame 11, and then, as in Example 3, a pellicle membrane 10 consisting of a single crystal silicon film and a porous supporting member was adhered to the upper annular face of the pellicle frame 11; then that portion of the pellicle membrane 10 which extended beyond the outer edges of the pellicle frame 11 was cut and removed, whereby a pellicle of Comparative Example 2 was completed.

In the end, this pellicle was adhered to a mask base plate measuring 150 mm×150 mm, and this pellicle-bearing mask base plate was put in a vacuum box and the pressure therein was reduced. The pressure reduction was conducted in the same manner as in Example 3, whereupon the pellicle membrane 10 was broken. The same experiment was repeated with a slower reduction of the pressure so as not to cause a breakage of the pellicle membrane 10; but it took two hours before the pressure reached 1 kPa.

INDUSTRIAL APPLICABILITY

From the above results, it was confirmed that, with the pellicle of the present invention, it is possible to expand the area of an opening of the air passage and that of the effective filtering area of the filter to cover it, so that it becomes possible to quickly cancel the differential pressure between the inside of the pellicle closed space and the outside of the same, so that the problem of the breakage of the pellicle membrane and the like has been solved.

EXPLANATION OF REFERENCE NUMERAL

10: pellicle
11: pellicle frame
12: filter
13: pellicle membrane-bonding adhesive layer
14: mask-bonding agglutinant layer
15: air passage
16: pellicle closed space
17: opening inside pellicle closed space
18: opening outside pellicle closed space
20: pellicle membrane
21: pellicle frame
22: filter
23: pellicle membrane-bonding layer
24: mask-bonding layer
25: air passage
26: pellicle closed space
27: opening inside pellicle closed space
28: opening outside pellicle closed space
29: protrusion

What is claimed is:

1. A pellicle comprising a pellicle frame, a pellicle membrane bonded to an upper annular face of said pellicle frame, an air passage penetrating a bar of said pellicle frame for communicating a pellicle closed space with an external atmosphere, and a filter disposed to close at least part of said air passage, wherein at least one of the opening of said air passage that opens in said pellicle closed space and the opening of said air passage that opens outside said pellicle closed space is disposed to look either in an upward direction or in a downward direction; said upward direction being a direction facing a plane which includes said pellicle membrane.

2. The pellicle as claimed in claim 1, wherein said filter is disposed to close at least part of said at least one of the openings that looks either in the upward direction or in the downward direction.

3. The pellicle as claimed in claim 1, wherein said filter is disposed to close the opening of said air passage that opens in said pellicle closed space or the opening of said air passage that opens outside said pellicle closed space.

4. The pellicle as claimed in claim 3, wherein said opening of said air passage that opens inside said pellicle closed space or said opening of said air passage that opens outside said pellicle closed space is disposed to look upward.

5. The pellicle as claimed in claim 1, wherein said filter is provided either inside said air passage or outside said air passage.

6. The pellicle as claimed in claim 1, wherein said air passage is either bent or curved.

7. The pellicle as claimed in claim 1, wherein said air passage is formed to pass through a protrusion which protrudes from either the inner wall of said pellicle frame or the outer wall of said pellicle frame.

8. The pellicle as claimed in claim 7, wherein said protrusion is formed all around said pellicle frame endlessly.

\* \* \* \* \*